(12) United States Patent
Fukuzono et al.

(10) Patent No.: US 8,023,268 B2
(45) Date of Patent: Sep. 20, 2011

(54) PRINTED CIRCUIT BOARD UNIT AND SEMICONDUCTOR PACKAGE

(75) Inventors: Kenji Fukuzono, Kawasaki (JP); Hideaki Yoshimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/461,867

(22) Filed: Aug. 26, 2009

(65) Prior Publication Data
US 2010/0014254 A1   Jan. 21, 2010

Related U.S. Application Data

(63) Continuation of application No. PCT/JP2007/053631, filed on Feb. 27, 2007.

(51) Int. Cl.
*H05K 7/20* (2006.01)
(52) U.S. Cl. .............. 361/719; 361/679.46; 361/679.54; 361/704; 361/707; 361/720; 165/80.3; 165/80.2; 165/104.33; 257/704; 257/706; 257/712; 174/16.3; 174/252
(58) Field of Classification Search .............. 361/679.46, 361/679.54, 690, 702–712, 715, 717–724, 361/760–764; 165/80.2, 80.3, 104.33, 185; 174/15.1, 16.3, 250–260; 257/675, 737, 257/738, 706–727, E21.514, E21.499, 786, 257/796; 438/106–108, 118, 122, 455, 464; 29/832, 840
See application file for complete search history.

(56) References Cited

U.S. PATENT DOCUMENTS

| | | | | |
|---|---|---|---|---|
| 5,909,056 A | * | 6/1999 | Mertol | 257/704 |
| 5,909,057 A | * | 6/1999 | McCormick et al. | 257/704 |
| 6,058,015 A | * | 5/2000 | Sammakia et al. | 361/705 |
| 6,259,154 B1 | * | 7/2001 | Niwa | 257/678 |
| 6,410,981 B2 | * | 6/2002 | Tao | 257/704 |
| 6,515,360 B2 | * | 2/2003 | Matsushima et al. | 257/704 |
| 6,590,278 B1 | * | 7/2003 | Behun et al. | 257/675 |
| 6,593,652 B2 | * | 7/2003 | Shibata | 257/710 |
| 6,617,683 B2 | * | 9/2003 | Lebonheur et al. | 257/707 |
| 6,703,704 B1 | * | 3/2004 | Alcoe et al. | 257/688 |
| 6,825,556 B2 | * | 11/2004 | Joshi et al. | 257/707 |

(Continued)

FOREIGN PATENT DOCUMENTS

JP    10-340970 A    12/1998

(Continued)

OTHER PUBLICATIONS

International Search Report for PCT/JP2007/053631, mailed May 29, 2007.

(Continued)

*Primary Examiner* — Michail V Datskovskiy
(74) *Attorney, Agent, or Firm* — Fujitsu Patent Center (57) ABSTRACT

A terminal bump set including the outermost bump row inscribed in a first prism standing upright on the front surface of a package substrate. A heat conductive member contacts with the surface of the semiconductor element. The heat conductive member extends outward beyond the contour of the semiconductor element. A reinforcing member is interposed between the heat conductive member and the package substrate outside the contour of the semiconductor element. The reinforcing member is bonded to the front surface of the package substrate at a predetermined bonding area. The predetermined bonding area extends inward from the outer periphery of the package substrate over the front surface of the package substrate. The second prism stands upright on the front surface of the package substrate inside the first prism so as to allow the outermost bump row to circumscribe the second prism.

4 Claims, 9 Drawing Sheets

U.S. PATENT DOCUMENTS

| | | | |
|---|---|---|---|
| 6,909,176 B1 * | 6/2005 | Wang et al. | 257/706 |
| 6,949,404 B1 * | 9/2005 | Fritz et al. | 438/106 |
| 7,045,890 B2 * | 5/2006 | Xie et al. | 257/706 |
| 7,102,228 B2 * | 9/2006 | Kanda | 257/730 |
| 7,126,217 B2 * | 10/2006 | Chiu et al. | 257/704 |
| 7,144,756 B1 * | 12/2006 | Wang et al. | 438/106 |
| 7,224,057 B2 * | 5/2007 | Yang | 257/707 |
| 7,228,440 B1 * | 6/2007 | Giles et al. | 713/168 |
| 7,352,062 B2 * | 4/2008 | Joshi et al. | 257/706 |
| 7,459,782 B1 * | 12/2008 | Li | 257/702 |
| 7,538,421 B2 * | 5/2009 | Chen | 257/704 |
| 2003/0030140 A1 * | 2/2003 | Shim | 257/712 |
| 2005/0029655 A1 | 2/2005 | Wu | |
| 2005/0161816 A1 | 7/2005 | Kanda | |
| 2006/0118947 A1 * | 6/2006 | Yuan et al. | 257/706 |
| 2007/0069366 A1 * | 3/2007 | Chang et al. | 257/700 |
| 2007/0145571 A1 * | 6/2007 | Lee et al. | 257/706 |
| 2008/0042263 A1 * | 2/2008 | Wang et al. | 257/712 |

FOREIGN PATENT DOCUMENTS

| | | |
|---|---|---|
| JP | 11-87410 | 3/1999 |
| JP | 11-220055 | 8/1999 |
| JP | 2001-110926 | 4/2001 |
| JP | 2002-33424 | 1/2002 |
| JP | 2002-190560 | 7/2002 |
| JP | 2005-64118 | 3/2005 |
| JP | 2007-305761 | 11/2007 |
| WO | 2004/086498 A1 | 10/2004 |

OTHER PUBLICATIONS

English Translation of the International Preliminary Report on Patentability and Written Opinion mailed Sep. 11, 2009 and issued in corresponding International Patent Application PCT/JP2007/053631.

The State Intellectual Property Office of the People's Republic of China, Office Action mailed Jun. 9, 2010, in connection with correspondent patent application No. CN 2007080051689. English-language translation provided.

* cited by examiner

PRINTED CIRCUIT BOARD UNIT AND SEMICONDUCTOR PACKAGE

CROSS-REFERENCE TO RELATED APPLICATION

This application is a continuing application, filed under 35 U.S.C. §111(a), of International Application PCT/JP2007/053631, filed on Feb. 27, 2007, the contents of which are incorporated herein by reference.

FIELD

The embodiments discussed herein are related to a printed circuit board unit including a semiconductor package, for example.

BACKGROUND

A large-scale integrated circuit (LSI) package is mounted on a motherboard, for example. Terminal bumps are arranged in a matrix on the motherboard for mounting the LSI package on the motherboard. An LSI chip is mounted on a package substrate in the LSI package. The LSI chip is surrounded by a stiffener on the front surface of the package substrate. The stiffener serves to increase the rigidity of the package substrate. A heat spreader is attached to the surface of the LSI chip. The stiffener is placed in a space between the package substrate and the heat spreader.

The terminal bumps include the outermost bump row. The outermost bump row is inscribed in a prism standing upright on the front surface of the package substrate. The contour of the stiffener coincides with that of the heat spreader. The outer periphery of the stiffener is inscribed in the prism. A bonding material is interposed between the stiffener and the package substrate and between the stiffener and the heat spreader. The stiffener is bonded to the package substrate and the heat spreader through the bonding material.

SUMMARY

According to a first aspect of the present invention, there is provided a printed circuit board unit comprising: a package substrate; a semiconductor element mounted on the front surface of the package substrate; a terminal bump set placed on the back surface of the package substrate, the terminal bump set including the outermost bump row inscribed in a first prism standing upright on the front surface of the package substrate; a heat conductive member contacting with the surface of the semiconductor element, the heat conductive member extending outward beyond the contour of the semiconductor element; a reinforcing member interposed between the heat conductive member and the package substrate at a position outside the contour of the semiconductor element, the reinforcing member bonded to the front surface of the package substrate at a predetermined bonding area and contained inside a second prism, the predetermined bonding area extending inward from the outer periphery of the package substrate over the front surface of the package substrate, the second prism standing upright on the front surface of the package substrate inside the first prism so as to allow the outermost bump row to circumscribe the second prism; and a motherboard having a surface receiving the terminal bump set.

According to a second aspect of the present invention, there is provided a printed circuit board unit comprising: a package substrate; a semiconductor element mounted on the front surface of the package substrate; a terminal bump set placed on the back surface of the package substrate, the terminal bump set including the outermost bump row inscribed in a first prism standing upright on the front surface of the package substrate; a heat conductive member contacting with the surface of the semiconductor element, the heat conductive member extending outward beyond the contour of the semiconductor element; a reinforcing member interposed between the heat conductive member and the package substrate at a position outside the contour of the semiconductor element; a bonding material extending inward from a second prism over the front surface of the package substrate so as to bond the reinforcing member to the front surface of the package substrate, the second prism standing upright on the front surface of the package substrate inside the first prism so as to allow the outermost bump row to circumscribe the second prism; and a motherboard having a surface receiving the terminal bump set.

The object and advantages of the embodiment will be realized and attained by means of the elements and combinations particularly pointed out in the appended claims. It is to be understood that both the foregoing general description and the following detailed description are exemplary and explanatory and are not restrictive of the embodiment, as claimed.

DESCRIPTION OF EMBODIMENTS

Description will be made below on embodiments of the present invention with reference to the attached drawings.

Figure 1:
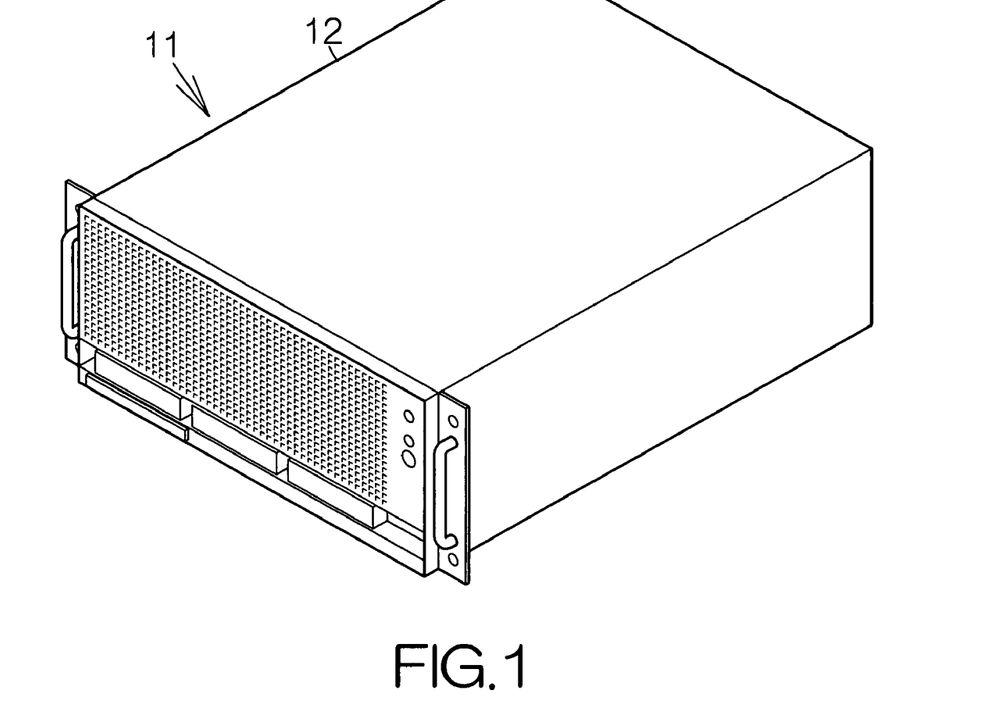
FIG. 1 is a perspective view schematically depicting a server computer as a specific example of an electronic apparatus according to an embodiment.

FIG. 1 schematically illustrates a server computer apparatus 11 as a specific example of an electronic apparatus according to an embodiment. A server computer apparatus 11 includes an enclosure 12. The enclosure 12 defines an inner space. A motherboard is placed within the inner space, for example. A semiconductor package, a memory, and the like, are mounted on the motherboard. The semiconductor package will be described later in detail. The semiconductor package is configured to execute various kinds of processing based on a software program and data temporarily held in the memory, for example. The software program and data may be stored in a large-capacity storage such as a hard disk drive, HDD, likewise placed within the inner space. The server computer apparatus 11 is mounted on a rack, for example.

Figure 2:
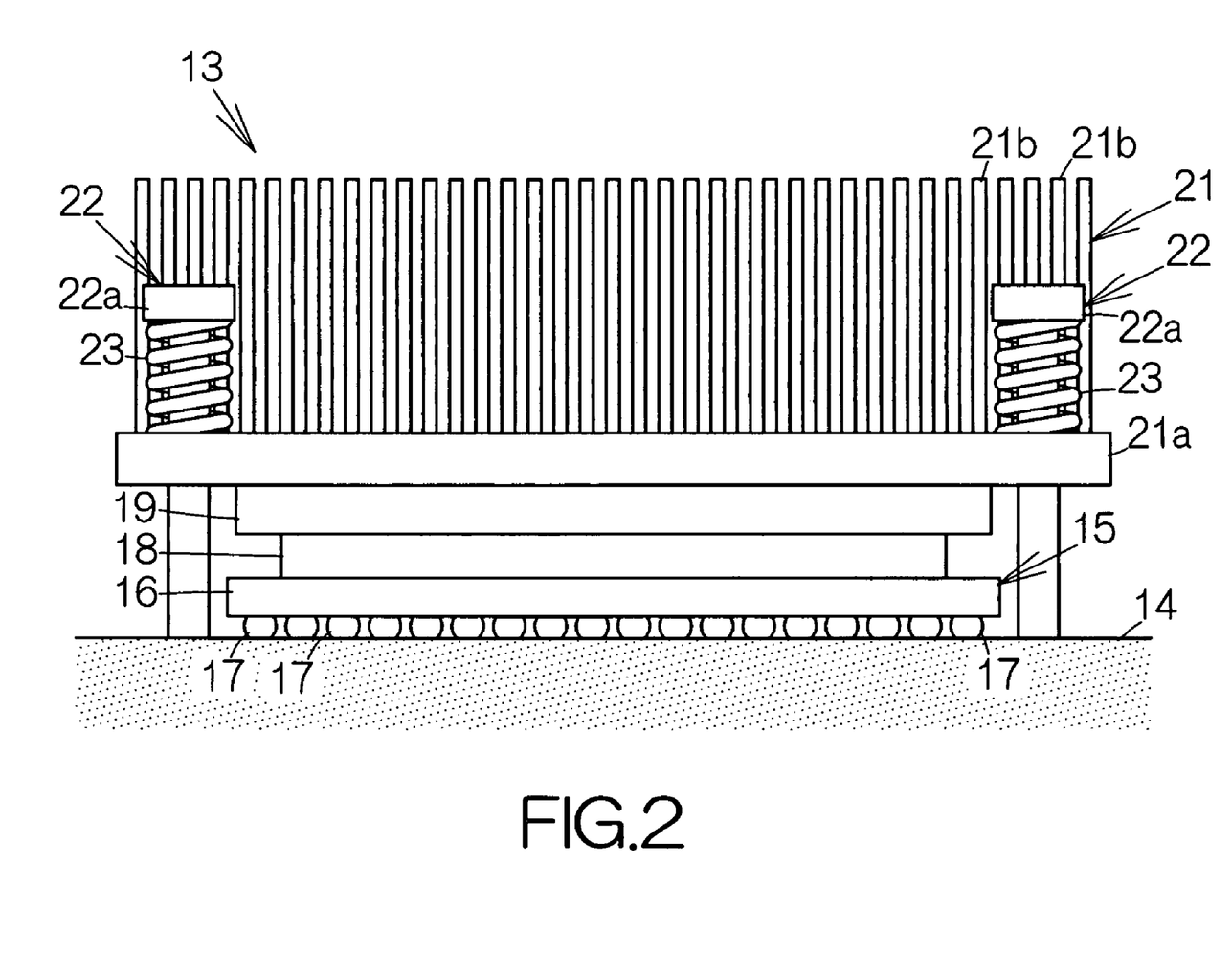
FIG. 2 is a side view schematically depicting a printed circuit board unit according to a first embodiment.

As depicted in FIG. 2, a motherboard 13 as a printed circuit board unit according to a first embodiment includes a printed wiring board 14. A substrate made of resin is employed as the printed wiring board 14, for example. The semiconductor package, namely a large-scale integrated circuit (LSI) package 15, is mounted on the flat surface of the printed wiring board 14. The LSI package 15 includes a package substrate 16. The package substrate 16 is a ceramic substrate, for example. Terminal bumps 17 are arranged in a matrix on the surface of the printed wiring board 14. The package substrate 16 is received on the terminal bumps 17. The terminal bumps 17 serve to bond the package substrate 16 to the surface of the printed wiring board 14. The terminal bumps 17 may be made of a solder material, for example. The solder material is a lead-free solder, for example. An Sn—Ag—Cu alloy is employed as the lead-free solder, for example. The package substrate 16 is received on the terminal bumps 17. The terminal bumps 17 form a terminal bump set.

A reinforcing member, namely a stiffener 18, is received on the flat surface of the package substrate 16. The stiffener 18 is made of a metallic material such as copper, for example. A heat conductive member, namely a heat spreader 19, is received on the stiffener 18. The heat spreader 19 is made of a metallic material such as copper, for example. A heat dissipating member, namely a heat sink 21, is received on the heat spreader 19. The heat sink 21 includes a flat base plate 21a and a plurality of fins 21 each standing upright from the base plate 21a in a vertical direction. The flat lower surface of the base plate 21a is overlaid on the upper surface of the heat spreader 19. Parallel air passages are defined between the adjacent ones of the fins 21b. The heat sink 21 may be made of a metallic material such as aluminum or copper, for example. Molding process may be employed to make the heat sink 21, for example.

The LSI package 15 is interposed between the heat sink 21 and the printed wiring board 14. Bolts 22, four of them, are utilized to couple the heat sink 21, for example. The tip ends of the bolts 22 are screwed into the printed wiring board 14. The individual bolt 22 is kept in an upright attitude relative to the surface of the printed wiring board 14. The individual bolt 22 penetrates through the base plate 21a of the heat sink 21. An elastic member 23 is interposed between the bolt head 22a of the individual bolt 22 and the base plate 21a. The elastic member 23 may be a coil spring exhibiting an elastic force in a direction of elongation between the bolt head 22a and the base plate 21a, for example. The base plate 21a is thus allowed to exhibit an urging force toward the printed wiring board 14. The bolt 22, the elastic member 23 and the base plate 21a in combination serve as an urging mechanism according to an embodiment.

Figure 3:
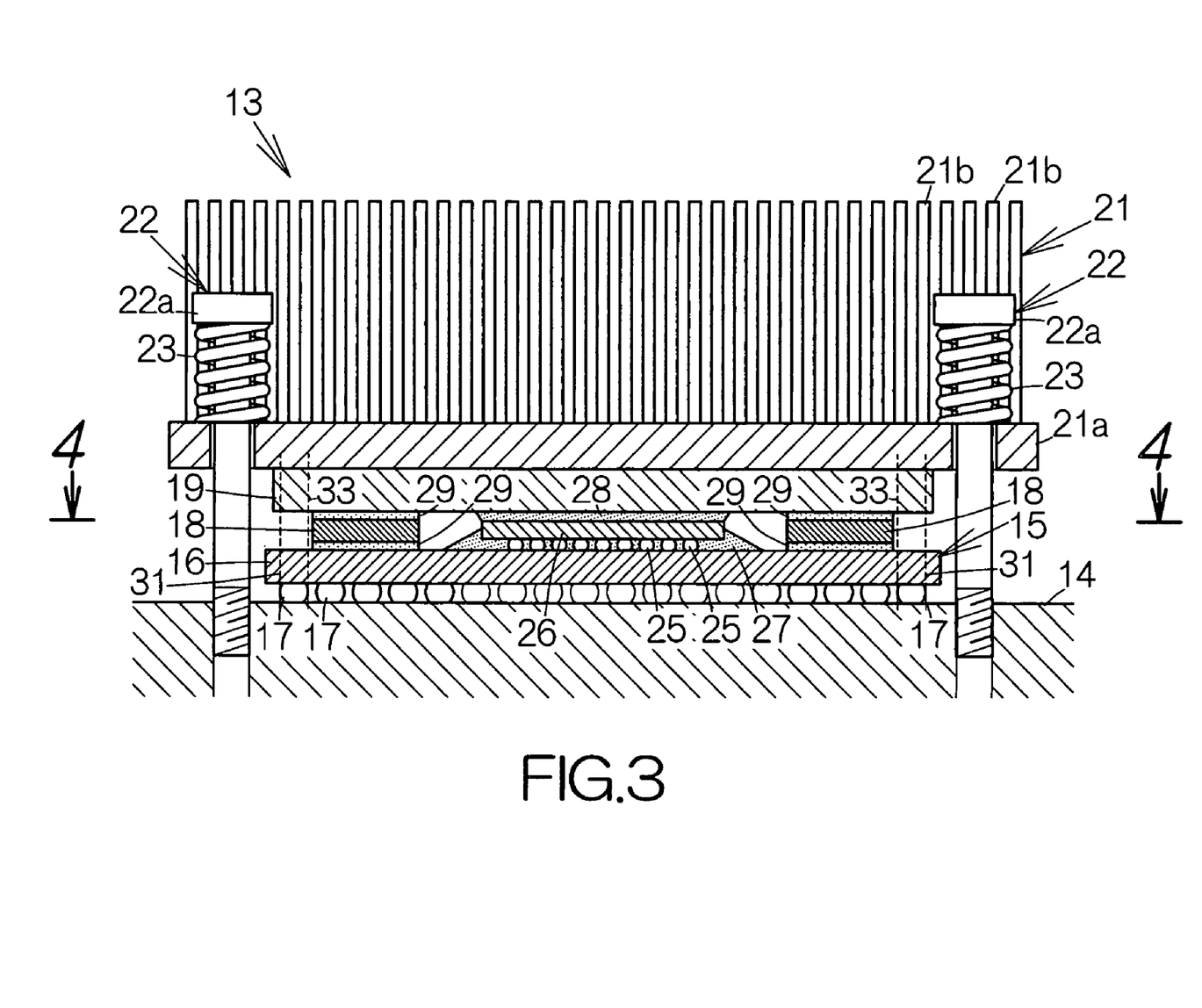
FIG. 3 is a sectional view of a motherboard, a semiconductor package and a heat sink.

As depicted in FIG. 3, terminal bumps 25 are arranged in a matrix on the surface of the package substrate 16 within a specific area. A semiconductor element, namely an LSI chip 26, is received on the terminals bumps 25. The LSI chip 26 is mounted on the package substrate 16 in this manner. The terminal bumps 25 are sealed on the package substrate 16. A resin material 27 is utilized to fill a space between the LSI chip 26 and the package substrate 16 for sealing the terminal bumps 25. The heat spreader 19 contacts with the surface of the LSI chip 26. The heat spreader 19 extends outward beyond the contour of the LSI chip 26. A bonding material 28 having a thermal conductivity is interposed between the LSI chip 26 and the heat spreader 19. The bonding material 28 extends on the surface of the LSI chip 26 by a constant thickness. A low-temperature solder is employed as the bonding material 28, for example.

A fluid having a thermal conductivity, such as a thermal grease, not depicted, may be interposed between the heat spreader 19 and the base plate 21a of the heat sink 21. The LSI chip 26 generates heat during operation. The heat of the LSI chip 26 is transferred to the heat spreader 19 via the bonding material 28. The heat spreader 19 serves to spread the heat of the LSI chip 26 over a wide range. The spread heat is transferred to the heat sink 21. The heat sink 21 serves to dissipate the heat into the air from its surface of a large surface area. In this manner, a rise in the temperature of the LSI chip 26 is effectively suppressed.

The aforementioned stiffener 18 is placed at a position outside the contour of the LSI chip 26. A bonding material 29 is interposed between the stiffener 18 and the package substrate 16 and between the stiffener 18 and the heat spreader 19. A thermosetting adhesive may be employed as the bonding material 29, for example. The stiffener 18 is in this manner bonded to the package substrate 16 and the heat spreader 19. As a result, the stiffener 18 bears the weight of the heat sink 21. The load on the LSI chip 26 applied from the heat sink 21 is reduced. Damage to the LSI chip 26 is prevented. The stiffener 18 simultaneously enhances the rigidity of the package substrate 16. A solder material may be employed as the bonding material 29 in place of the adhesive.

Figure 4:
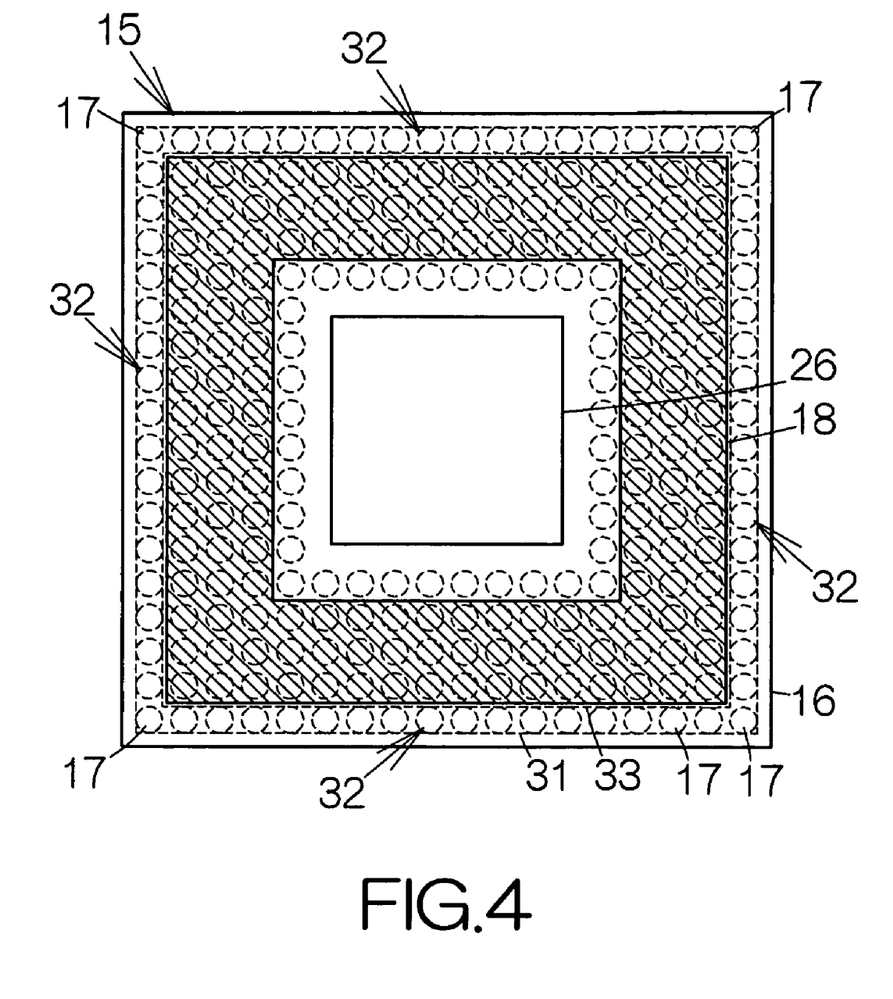
FIG. 4 is a sectional view taken along the line 4-4 in FIG. 3.

Referring also to FIG. 4, the stiffener 18 endlessly extends around the outer periphery of the LSI chip 26 on the package substrate 16. The stiffener 18 is interposed between the package substrate 16 and the heat spreader 19 over its entire length. The terminal bump set includes the outermost bump row 32 inscribed in a first prism 31 standing on the surface of the package substrate 16. A second prism 33 is defined inside the first prism 31. The second prism 33 stands on the surface of the package substrate 16. The second prism 33 allows the outermost bump row 32 to circumscribe the second prism 33. The stiffener 18 is entirely placed inside the second prism 33. The stiffener 18 is bonded to the package substrate 16 and the heat spreader 19 through the bonding material 29 at a bonding area extending inward from the second prism 33.

The motherboard 13 suffers from heat generated at the LSI chip 26 in operation, as described above. The heat of the LSI chip 26 is transferred to the package substrate 16 and the printed wiring board 14. A ceramic substrate is employed as the package substrate 16. A resin substrate is employed in the printed wiring board 14. The coefficient of thermal expansion of the package substrate 16 is considerably different from that of the printed wiring board 14. A stress is generated in the package substrate 16. However, the stiffener 18 is placed on the package substrate 16 inside the second prism 33. Compared with the case where the stiffener 18 is boned to the package substrate 16 and the heat spreader 19 outside the second prism 33, an increase in the rigidity of the package substrate 16 is suppressed. The concentration of the stress at the corners of the package substrate 16 is avoided. Damage to the terminal bumps 17 is avoided at the outermost bump row 32.

The inventors have observed the effect of the motherboard 13 according to the embodiment. Simulation was performed for the observation. A specific example according to the embodiment employed the stiffener 18 completely placed inside the second prism 33. A comparative example according to a conventional example employed the stiffener 18 bonded to the package substrate 16 and the heat spreader 19 via the bonding material 29 outside the second prism 33.

The length of one side of the printed wiring board 14 was set at 250 mm. The coefficient of thermal expansion of the printed wiring board 14 was set at 16 [ppm/K]. The length of one side of the package substrate 16 was set at 42.5 mm. The coefficient of thermal expansion of the package substrate 16 was set at 11 [ppm/K]. The Young's modulus of the package substrate 16 was set at 75 [GPa].

The maximum von Mises stress and equivalent plastic strain of the terminal bump set were measured when the LSI chip 26 generated heat. As a result, the maximum von Mises stress was reduced from 40.15 [MPa] to 36.78 [MPa]. It was improved by 8.4%. In addition, the equivalent elastic strain was reduced from 0.015920 to 0.006565. It was improved by 58.8%. It has been confirmed that the concentration of the stress at the corners of the package substrate 16 is avoided.

Figure 5:
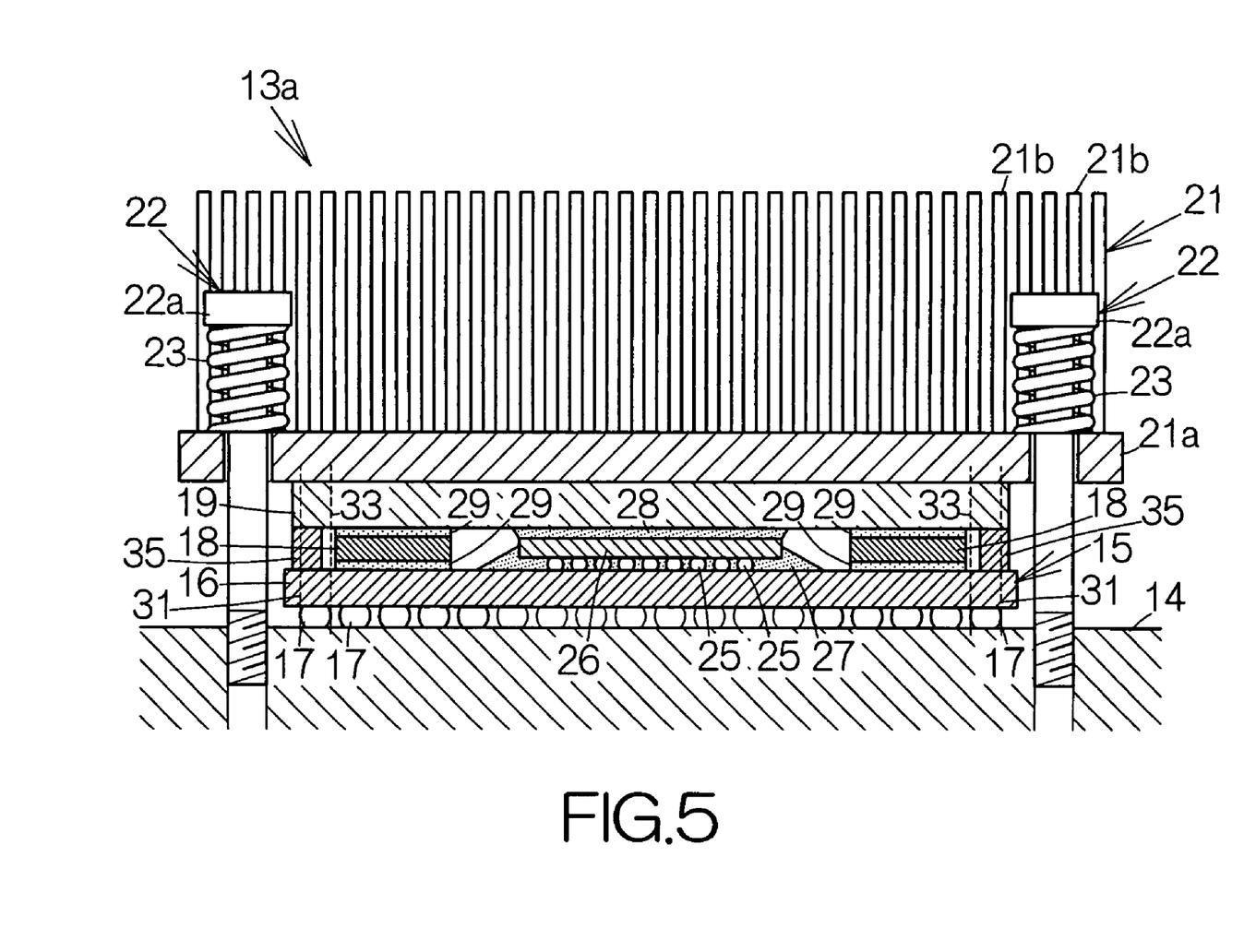
FIG. 5 is a sectional view schematically depicting a printed circuit board unit according to a second embodiment.

As depicted in FIG. 5, a motherboard 13a according to a second embodiment includes an auxiliary reinforcing member 35 interposed between the package substrate 16 and the heat spreader 19 at a position outside the stiffener 18. The auxiliary reinforcing member 35 is placed in the first prism 31 outside the second prism 33. The auxiliary reinforcing member 35 is made of a metallic material, for example. No bonding material is interposed between the auxiliary reinforcing member 35 and the package substrate 16 and between the auxiliary reinforcing member 35 and the heat spreader 19. Specifically, the auxiliary reinforcing member 35 is not bonded to the package substrate 16 and the heat spreader 19.

Figure 6:
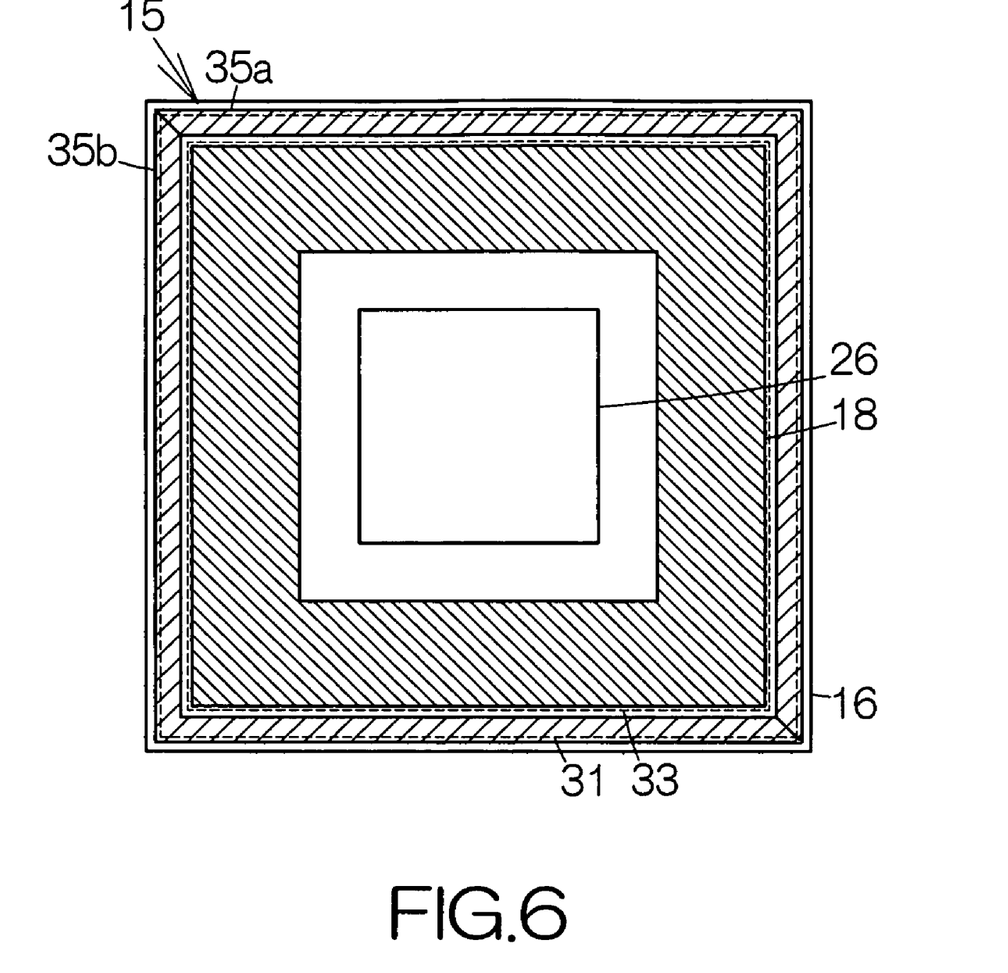
FIG. 6 is a sectional view schematically depicting an auxiliary reinforcing member according to a specific example.

Referring also to FIG. 6, the auxiliary reinforcing member 35 endlessly extends around the outer periphery of the stiffener 18. The auxiliary reinforcing member 35 may include an L-shaped first member 35a and an L-shaped second member 35b, for example. Like reference numerals are attached to the structure or components equivalent to those of the aforementioned motherboard 13. The bolts 22 and the elastic members 23 are coupled to the base plate 21a of the heat sink 21, as described above. As a result, the auxiliary reinforcing member 35 is prevented from falling out of the space between the package substrate 16 and the heat spreader 19 with the assistance of the urging force of the base plate 21a.

Even though a relatively large urging force is applied from the heat spreader 19 toward the package substrate 16 in the motherboard 13a, for example, the load of the urging force is supported not only on the stiffener 18 but also on the auxiliary reinforcing member 35. The load on the LSI chip 26 applied from the heat sink 21 is reduced. Damage to the LSI chip 26 and the package substrate 16 is prevented. The auxiliary reinforcing member 35 is not bonded to the package substrate 16 and the heat spreader 19. Compared with the case where the stiffener 18 is boned to the package substrate 16 and the heat spreader 19 outside the second prism 33, an increase in the rigidity of the package substrate 16 is suppressed, in the same manner as described above. The concentration of the stress at the corners of the package substrate 16 is avoided. Damage to the terminal bumps 17 is avoided at the outermost bump row 32.

Figure 7:
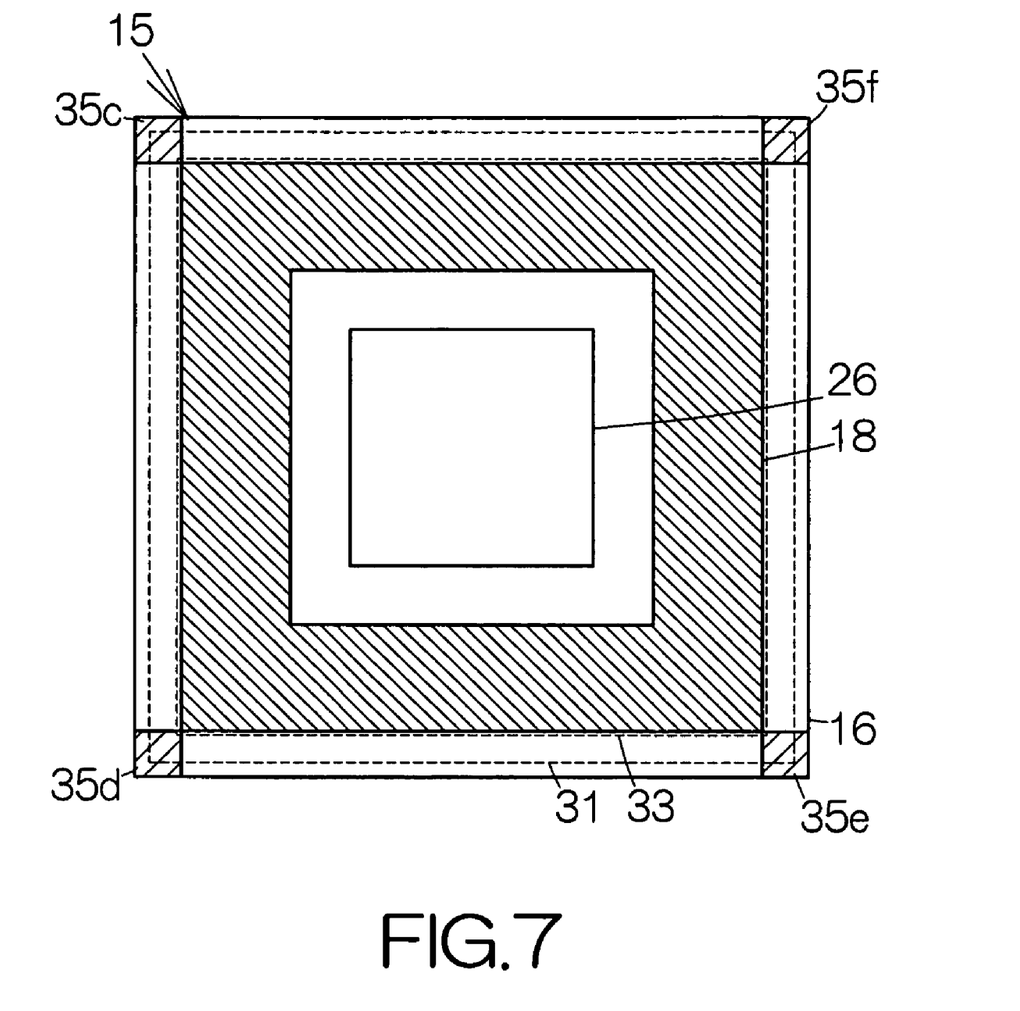
FIG. 7 is a sectional view schematically depicting an auxiliary reinforcing member according to another specific example.

As depicted in FIG. 7, auxiliary reinforcing members 35c, 35d, 35e, 35f may be placed between the package substrate 16 and the heat spreader 19 at the corners of the package substrate 16, respectively, in place of the aforementioned first member 35a and second member 35b. The auxiliary reinforcing members 35c-35f are not bonded to the package substrate 16 and the heat spreader 19. The auxiliary reinforcing members 35c-35f are made of a metallic material in the same manner as described above. The auxiliary reinforcing members 35c-35f receive the urging force at the four corners of the package substrate 16, respectively. The load on the LSI chip 26 applied from the heat sink 21 is reduced, in the same manner as described above. Damage to the LSI chip 26 and the package substrate 16 is prevented.

Figure 8:
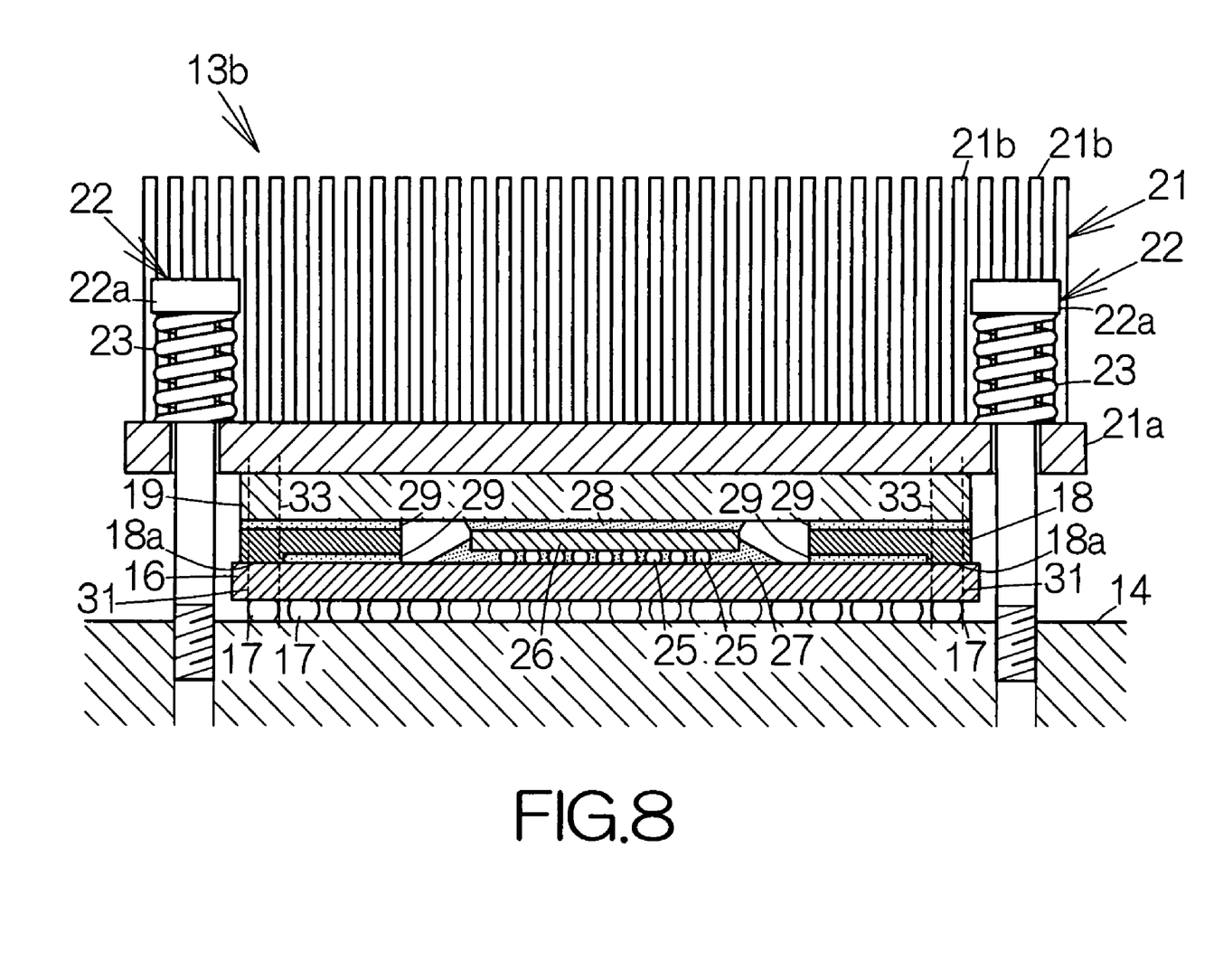
FIG. 8 is a sectional view schematically depicting a printed circuit board unit according to a third embodiment.

As depicted in FIG. 8, a motherboard 13b according to a third embodiment includes the stiffener 18 protruding outward beyond the contour of the second prism 33. The stiffener 18 includes a contact surface 18a contacting with the surface of the package substrate 16 outside the second prism 33. No bonding material is placed between the contact surface 18a and the package substrate 16. Specifically, the contact surface 18a and the package substrate 16 are not bonded to each other. The lower surface of the stiffener 18 is bonded to the package substrate 16 inside the second prism 33 through the bonding material 29. The entire upper surface of the stiffener 18 is bonded to the heat spreader 19 through the bonding material 29. Like reference numerals are attached to the structure or components equivalent to those of the aforementioned motherboard 13.

The motherboard 13b allows the stiffener 18 to receive the urging force both at the inside and outside of the contour of the second prism 33, in the same manner as described above. The load on the LSI chip 26 applied from the heat sink 21 is reduced. Damage to the LSI chip 26 and the package substrate 16 is prevented. The contact surface 18a is not bonded to the package substrate 16. Compared with the case where the stiffener 18 is boned to the package substrate 16 and the heat spreader 19 outside the second prism 33, an increase in the rigidity of the package substrate 16 is suppressed, in the same manner as described above. The concentration of the stress at the corners of the package substrate 16 is avoided. Damage to the terminal bumps 17 is avoided at the outermost bump row 32.

Figure 9:
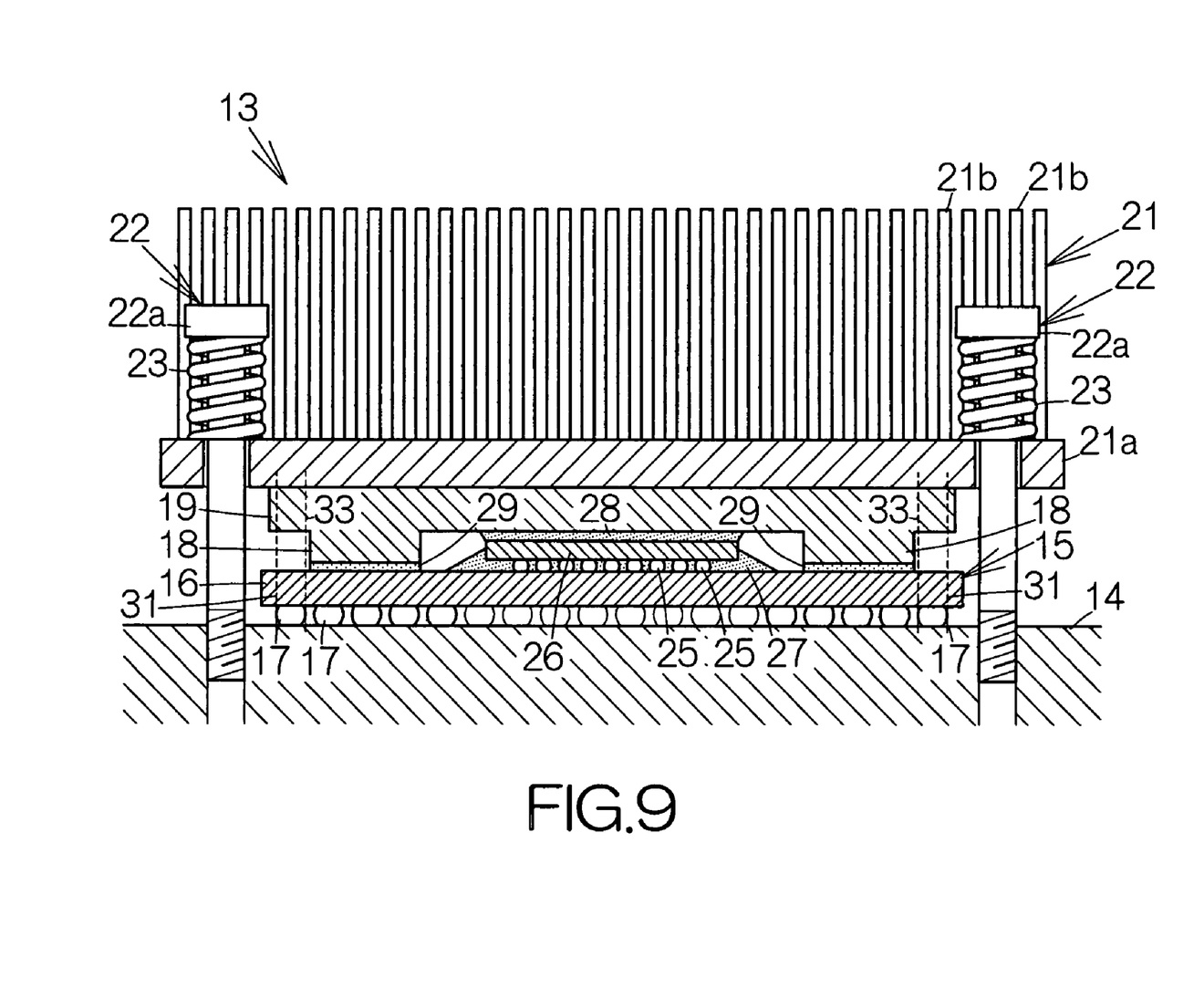
FIG. 9 is a sectional view schematically depicting a printed circuit board unit according to another specific example.

Any of the aforementioned motherboards 13, 13a, 13b may include the stiffener 18 integral with the heat spreader 19. As depicted in FIG. 9, the stiffener 18 is formed integral with the lower surface of the heat spreader 19, for example, in the motherboard 13. The lower surface of the stiffener 18 is bonded to the surface of the package substrate 16. Like reference numerals are attached to the structure or components equivalent to those of the aforementioned ones. Likewise, in either of the motherboards 13a, 13b, the stiffener 18 may be formed integral with the lower surface of the heat spreader 19.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A printed circuit board unit comprising:
   a package substrate;
   a semiconductor element mounted on a front surface of the package substrate;
   a terminal bump set placed on a back surface of the package substrate, the terminal bump set including an outermost bump row inscribed in a first prism standing upright on the front surface of the package substrate;
   a heat conductive member contacting with a surface of the semiconductor element, the heat conductive member extending outward beyond a contour of the semiconductor element;
   a heat dissipating member contacting with a surface of the heat conductive member;
   a reinforcing member interposed between the heat conductive member and the package substrate at a position outside the contour of the semiconductor element, the reinforcing member bonded to the front surface of the package substrate at a predetermined bonding area and contained inside a second prism, the predetermined bonding area extending inward from an outer periphery of the package substrate over the front surface of the package substrate, the second prism standing upright on the front surface of the package substrate inside the first prism so as to allow the outermost bump row to circumscribe the second prism;

an auxiliary reinforcing member interposed between the heat conductive member and the package substrate at a position outside a contour of the reinforcing member, the auxiliary reinforcing member contacting the package substrate without bonding, the auxiliary reinforcing member being placed inside the first prism and outside the second prism;

a motherboard having a surface receiving the terminal bump set; and an urging mechanism exhibiting an urging force urging the heat conductive member toward the motherboard, wherein the heat conductive member extends outward beyond a contour of the reinforcing member.

2. A printed circuit board comprising:

a package substrate;

a semiconductor element mounted on a front surface of the package substrate;

a terminal bump set placed on a back surface of the package substrate, the terminal bump set including an outermost bump row inscribed in a first prism standing upright on the front surface of the package substrate;

a heat conductive member contacting with a surface of the semiconductor element, the heat conductive member extending outward beyond a contour of the semiconductor element;

a reinforcing member interposed between the heat conductive member and the package substrate at a position outside a contour of the semiconductor element;

a bonding material extending inward from a second prism over the front surface of the package substrate so as to bond the reinforcing member to the front surface of the package substrate, the second prism standing upright on the front surface of the package substrate inside the first prism so as to allow the outermost bump row to circumscribe the second prism; and a motherboard having a surface receiving the terminal bump set, wherein the reinforcing member defines a contact surface contacting with the front surface of the package substrate outside the second prism without bonding.

3. An electronic apparatus comprising:

an enclosure;

a motherboard enclosed in the enclosure;

a package substrate;

a semiconductor element mounted on a front surface of the package substrate;

a terminal bump set placed on a back surface of the package substrate so as to mount the package substrate on the motherboard, the terminal bump set including an outermost bump row inscribed in a first prism standing upright on the front surface of the package substrate;

a heat conductive member contacting with a surface of the semiconductor element, the heat conductive member extending outward beyond a contour of the semiconductor element;

a reinforcing member interposed between the heat conductive member and the package substrate at a position outside a contour of the semiconductor element; and a bonding material extending inward from a second prism over the front surface of the package substrate so as to bond the reinforcing member to the front surface of the package substrate, the second prism standing upright on the front surface of the package substrate inside the first prism so as to allow the outermost bump row to circumscribe the second prism, wherein the reinforcing member defines a contact surface contacting with the front surface of the package substrate outside the second prism without bonding.

4. A semiconductor package comprising:

a package substrate;

a semiconductor element mounted on a front surface of the package substrate;

a terminal bump set placed on a back surface of the package substrate, the terminal bump set including an outermost bump row inscribed in a first prism standing upright on the front surface of the package substrate;

a heat conductive member contacting with a surface of the semiconductor element, the heat conductive member extending outward beyond a contour of the semiconductor element;

a reinforcing member interposed between the heat conductive member and the package substrate at a position outside a contour of the semiconductor element;

a bonding material extending inward from a second prism over the front surface of the package substrate so as to bond the reinforcing member to the front surface of the package substrate, the second prism standing upright on the front surface of the package substrate inside the first prism so as to allow the outermost bump row to circumscribe the second prism, wherein the reinforcing member defines a contact surface contacting with the front surface of the package substrate outside the second prism without bonding.

* * * * *